United States Patent [19]
Tanahashi

[11] Patent Number: 6,064,084
[45] Date of Patent: *May 16, 2000

[54] SEMICONDUCTOR DEVICE HAVING A RELIABLE CONTACT STRUCTURE

[75] Inventor: Toru Tanahashi, Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/822,980

[22] Filed: Mar. 21, 1997

[30] Foreign Application Priority Data

Oct. 15, 1996 [JP] Japan .................................. 8-272679

[51] Int. Cl.⁷ .................... H01L 27/108; H01L 29/76; H01L 29/94; H01L 31/119
[52] U.S. Cl. .................... 257/296; 257/303; 257/306; 257/773; 257/774
[58] Field of Search .................... 257/296, 750, 257/751, 758, 760, 763, 767, 309, 303, 306, 752, 753, 774, 775, 773; 438/618, 622, 653, 672, 673, 674, 255, 254, 253, 637, 675, 666, 668, 665

[56] References Cited

U.S. PATENT DOCUMENTS

| | | | |
|---|---|---|---|
| Re. 34,583 | 4/1994 | Grief et al. | 257/750 |
| 4,531,144 | 7/1985 | Holmberg | 357/71 |
| 4,920,070 | 4/1990 | Mukai | 438/632 |
| 4,948,755 | 8/1990 | Mo | 438/674 |
| 5,040,049 | 8/1991 | Raaijmakers | 257/758 |
| 5,117,276 | 5/1992 | Thomas et al. | 257/758 |
| 5,250,472 | 10/1993 | Chen et al. | 438/699 |
| 5,284,799 | 2/1994 | Sato | 438/618 |
| 5,286,675 | 2/1994 | Chen et al. | 257/763 |
| 5,332,024 | 7/1994 | Kobayashi | 257/758 |
| 5,369,055 | 11/1994 | Chung | 438/655 |
| 5,442,235 | 8/1995 | Parrillo et al. | 257/758 |
| 5,453,154 | 9/1995 | Thomas et al. | 438/622 |
| 5,578,872 | 11/1996 | Chen et al. | 257/751 |
| 5,654,232 | 8/1997 | Gardner | 438/672 |
| 5,686,747 | 11/1997 | Jost et al. | 257/296 |
| 5,693,562 | 12/1997 | Tseng | 438/653 |
| 5,730,835 | 3/1998 | Roberts et al. | 257/750 |
| 5,747,379 | 5/1998 | Huang et al. | 438/672 |
| 5,776,825 | 7/1998 | Suganaga et al. | 438/622 |
| 5,808,855 | 9/1998 | Chan et al. | 257/303 |
| 5,856,007 | 1/1999 | Sharan et al. | 438/398 |
| 5,891,803 | 4/1999 | Gardner | 438/660 |

FOREIGN PATENT DOCUMENTS 2257564  1/1993  United Kingdom .................. 257/751

*Primary Examiner*—Olik Chaudhuri
*Assistant Examiner*—Phat X. Cao
*Attorney, Agent, or Firm*—Arent Fox Kintner Plotkin & Kahn

[57] ABSTRACT

A fabrication process of a semiconductor device includes a step of forming a conductive overhang structure at a top part of a contact hole in continuation with a thin conductive film covering an exposed bottom surface and an inner surface of said contact hole.

4 Claims, 14 Drawing Sheets

SEMICONDUCTOR DEVICE HAVING A RELIABLE CONTACT STRUCTURE

BACKGROUND OF THE INVENTION

The present invention generally relates to semiconductor devices and more particularly to a semiconductor structure that facilitates fabrication of a semiconductor integrated circuit with reduced number of fabrication steps while maintaining a reliable electrical contact at contact holes.

A DRAM (Dynamic Random Access Memory) is a high speed, volatile semiconductor memory device that stores information in a capacitor in the form of electric charges and is generally provided in the form of an integrated circuit. Thus, a DRAM integrated circuit includes a number of memory cells each formed of a memory cell capacitor and a cooperating memory cell transistor, in a state that the memory cells are integrated monolithically on a semiconductor substrate. As each of the memory cells has a simple structure, DRAM is particularly suitable for realizing a high integration density by way of miniaturization of the individual memory cells.

However, the attempt to realize a very large capacity DRAM, of which storage capacity reaches 1 Gbit or more, has revealed a problem that the capacitance of the memory cell capacitors becomes to small for a proper operation of the DRAM as a result of the excessive device miniaturization. In order to avoid this problem, various proposals are made so far.

For example, the U.S. Pat. No. 5,414,636 describes a DRAM structure that uses a stacked-fin type capacitor for the memory cell capacitor. By using the stacked-fin type capacitor, in which a number of electrode fins are stacked, it is possible to compensate for the decrease of the total area of the memory cell capacitor caused as a result of the device miniaturization.

However, such an attempt is successful only for those devices of which storage capacity is smaller than 256 Mbits. In order to realize a storage capacity of 256 Mbits or more, it is inevitable to increase the height of the memory cell capacitor, even when the stacked-fin type capacitor is used for the memory cell capacitor. However, such an increase in the height of the memory cell capacitor causes a difficulty of proper focusing at the time of exposure of minute patterns or contact holes, due to the undesirable formation of a step structure between a memory cell region of the DRAM, where the memory cells are formed, and a peripheral region where peripheral circuits of the DRAM are formed. It should be noted that an exposure of deep contact hole is essential for the fabrication of a DRAM of the stacked-fin type, while such an exposure of a deep contact hole by way of a high-resolution optical system is extremely difficult. A high-resolution optical system characteristically has a very small focal depth.

In order to overcome the foregoing difficulty, there is proposed a DRAM structure in the Japanese Laid-open Patent Publication 8-274278 corresponding to the United States patent application Ser. No. 08/592,481, in which a minute contact hole is formed in correspondence to a drain region of a memory cell transistor by a self-alignment process. In the proposed structure, a cylindrical electrode of a memory capacitor establishes an electrical contact with the drain region at such a minute contact hole. The cylindrical capacitor electrode, in turn, extends through a through-hole formed in an interlayer insulation film that covers the memory cell transistor in an upward direction away from a semiconductor substrate. As the through-hole thus formed has a diameter substantially larger than a diameter of the foregoing minute contact hole, the problem of severe alignment is successfully avoided when exposing the through-hole. For example, the exposure of the through-hole can be achieved successfully by using a low resolution optical system having a large focal depth.

FIG. 1 shows the construction of a conventional DRAM memory cell 10 disclosed in the foregoing Japanese Laid-open Patent Publication 8-274278, which is incorporated herein as a reference.

Referring to FIG. 10, the memory cell 10 includes a memory cell transistor on an active region 11B of a Si substrate 11, wherein the active region 11B is defined on a surface of the Si substrate 11 by a field oxide film 11A as usual. The memory cell transistor, in turn, includes a polysilicon gate pattern 13 provided on a gate oxide film 12 in the foregoing active region 11B, wherein the polysilicon gate pattern 13 forms a part of a word line WL as usual. Further, the substrate 11 is formed with diffusion regions 11C and 11D at both sides of a channel region CH formed in the active region 11B in correspondence to the gate pattern 13, as a source and a drain of the memory cell transistor. As usual, the diffusion regions 11C and 11D are formed in a self-alignment process that uses the gate pattern 13 as a mask.

In the structure of FIG. 1, the polysilicon gate pattern 13 is covered, at a top surface and both side walls thereof, with an insulation film 13C in conformity with a cross-sectional shape of the gate pattern 13. Thus, there are formed an opening $(11C)_C$ and another opening $(11D)_C$ respectively exposing the source region 11C and the drain region 1D, wherein it should be noted that each of the openings $(11C)_C$ and $(11D)_C$ is formed between a pair of adjacent gate patterns 13 automatically in a self-aligned process.

On the structure including the self-aligned openings $(11C)_C$ and $(11D)_C$ thus formed, a thin SiN film 14 and a thick interlayer insulation film 15 are deposited consecutively. Further, a through-holes 15A is formed in the interlayer insulation film 15 by an RIE process in correspondence to each of the foregoing diffusion regions 11C and 11D. Each of the through-holes 15A thus formed exposes, at a bottom part thereof, the SiN film 14 that contacts directly with the diffusion region 11C or the diffusion region 11D via the foregoing opening $(11C)_C$ or $(11D)_C$.

The SiN film 14 thus exposed is subsequently removed by an etching process, and a polysilicon film 16 is deposited on the inner surface of each of the through-holes 15A such that the polysilicon film 16 extends along the through-hole 15A and contacts with the exposed diffusion region 11C or 11D.

Further, a thin dielectric film 17 of $Ta_2O_5$ of $(Ba, Sr)TiO_3$ is deposited on the foregoing polysilicon film 16, and an inner space defined by the polysilicon film 16 is filled with a polysilicon column 18.

It should be noted that the polysilicon column 18 formed in correspondence to the drain region 11D projects beyond the top surface of the interlayer insulation film 15 and is covered by an insulation film 19. On the other hand, the polysilicon column 18 corresponding to the source region 11C carries thereon a bit line 20. The bit line 20 thereby contact with the source region 11C electrically via the polysilicon film 16 corresponding to the foregoing polysilicon column 18. In other words, the polysilicon film 16 corresponding to the source region 11C acts as a bit line contact structure L that connects the source region 11C to the bit line 20.

On the other hand, the polysilicon film 16 contacting with the drain region 11D forms a memory cell capacitor C together with the dielectric film 17 and the polysilicon column 18.

In the memory cell 10 of FIG. 1, it should be noted that the openings $(11C)_C$ and $(11D)_C$ are formed in a self-aligned process, without using a mask. In other words, the formation of the openings $(11C)_C$ and $(11D)_C$ can be achieved without taking into consideration the alignment error at the time of the mask process, and the size of the openings $(11C)_C$ and $(11D)_C$ can be reduced as desired. Further, the elimination of the mask process increases the throughput of fabrication of the device significantly. In addition, the formation of the electrode 20 on the planarized top surface of the interlayer insulation film 15 facilitates the submicron patterning of the interconnection pattern connected to the electrode 20.

On the other hand, the construction of FIG. 1 has a drawback in that the area of contact between the polysilicon film 16 forming the bit line contact structure L and the bit line pattern 20 is limited substantially. In other words, the structure of FIG. 1 suffers from the problem of increased resistance of the bit line contact structure L.

A similar problem occurs also in a general semiconductor device as long as the desired electrical contact is achieved by a contact hole that carries a thin conductive film such as an amorphous silicon film or a polysilicon film on a bottom surface as well as an inner surface of the contact hole.

FIGS. 2A–2C show the process of forming such a general contact hole.

Referring to FIG. 2A, an insulation film 2 of $SiO_2$ or BPSG (borophosphosilicate glass) is provided on a Si substrate 1 in which a diffusion region 1A is formed. Further, a contact hole 2A is formed in the Si substrate 1 so as to expose the diffusion region 1A, and a conductive film 3 of amorphous silicon or polysilicon is deposited on the contact hole 2A by a CVD process such that the conductive film 3 covers the bottom surface as well as the side wall of the contact hole 2A. Thus, the conductive film 3 establishes a two-dimensional contact with the diffusion region 1A at the bottom of the contact hole 2A.

Next, the conductive film 2 is removed for the part deposited above the insulation film 2 by a CMP (chemical mechanical polishing) process as indicated in FIG. 2A, and an $SiO_2$ film 4 is deposited on the structure thus obtained as indicated in FIG. 2B. As will be seen in FIG. 2B, the $SiO_2$ film 4 fills the depression formed inside the conductive film 3 in correspondence to the contact hole 2A.

Next, in the step of FIG. 2C, the $SiO_2$ film 4 is formed with an opening 4 so as to expose the top edge of the conductive film 3, and a conductive polysilicon electrode pattern 5 is deposited on the $SiO_2$ film 4 so as to include the foregoing opening 4A.

In the contact structure of FIG. 2C, it should be noted that the contact between the conductive film 3 and the electrode pattern 5 is limited to a circled region indicated in FIG. 2C. Thus, the contact structure of FIG. 2C inevitably suffers from the problem of increased contact resistance caused by a limited contact area.

SUMMARY OF THE INVENTION

Accordingly, it is a general object of the present invention to provide a novel and useful semiconductor device structure and a fabrication process thereof wherein the foregoing problems are eliminated.

Another and more specific object of the present invention is to provide a semiconductor device and a fabrication process thereof wherein the contact resistance is reduced.

Another object of the present invention is to provide a semiconductor memory device and a fabrication process thereof wherein the contact resistance of a bit line can be reduced without increasing the number of the fabrication steps substantially.

Another object of the present invention is to provide a fabrication process of a semiconductor device, comprising the steps of:

forming a first insulation film on a substrate;

forming a mask layer on said first insulation film;

patterning said mask layer so as to form an opening exposing a surface of said first insulation film;

applying an etchant to said first insulation film, said etchant acting upon said first insulation film with an etching rate exceeding an etching rate against said mask layer, to form a contact hole in said first insulation film in correspondence to said opening, such that said mask surface forms an overhang in said contact hole with respect to said contact hole;

depositing a first conductive film such that said first conductive film covers an inner surface and a bottom surface of said contact hole and such that said first conductive film further covers said overhang of said mask layer;

removing consecutively said first conductive film located above said mask layer and said mask layer until said first insulation film is exposed, such that a part of said first conductive film covering a bottom surface of said overhang forms a corresponding overhang structure; and depositing a second conductive film such that said second conductive film contacts with first conductive film intimately at said overhang structure.

Another object of the present invention is to provide a semiconductor device, comprising:

a substrate;

an insulation film provided on said substrate;

a contact hole formed in said insulation film;

a conductive film covering an inner surface and a bottom surface of said contact hole, said conductive film including an overhang part extending toward an inner side of said contact hole substantially in a plane of a top surface of said insulation film; and a conductive pattern provided on said insulation film in an intimate contact with said overhang of said conductive film.

Another object of the present invention is to provide a method of fabricating a semiconductor memory device, said semiconductor memory device including a memory cell transistor and a memory cell capacitor, said memory cell transistor comprising a gate pattern provided on a gate oxide film covering a semiconductor substrate, a first diffusion region formed in said semiconductor substrate adjacent to said gate pattern at a first side thereof, and a second diffusion region formed in said semiconductor substrate adjacent to said gate pattern at a second, opposite side thereof, said memory cell capacitor contacting with said first diffusion region, said method comprising the steps of:

covering a top surface and both side walls of said gate pattern by an insulation film in conformity with a cross-sectional shape of said gate pattern, such that first and second openings respectively exposing said first and second diffusion regions are formed such that said first opening is formed between a first pair of said gate patterns that are mutually adjacent to each other and such that said second opening is formed between a second pair of said gate patterns that are mutually adjacent to each other, each of said first and second diffusion regions thereby being defined in a self-aligned manner by said insulation film covering said mutually adjacent gate patterns;

depositing an interlayer insulation film on said semiconductor substrate so as to bury said gate pattern underneath;

providing a mask layer on said interlayer insulation film;

forming a third opening and a forth opening in said mask layer respectively in correspondence to said first and second openings so as to expose a top surface of said interlayer insulation film;

applying an etching process to said interlayer insulation film while using said mask layer as a mask, to form first and second through-holes in said interlayer insulation film respectively in correspondence to said third and fourth openings, such that said first through-hole has a diameter larger than a diameter of said third opening and such that said second through-hole has a diameter larger than a diameter of said fourth opening, said first and second through-holes being formed such that said first through-hole exposes said first diffusion region and such that said second through-hole exposes said second diffusion region;

depositing a conductive film such that said conductive film covers an inner wall of said first and second through-holes and such that said conductive film covers said exposed first and second diffusion regions and further an exposed surface of said mask layer;

removing a part of said conductive film locating above said mask layer and further said mask layer itself consecutively, to form first and second conductive patterns respectively in said first and second through-holes, such that said first-through-hole is in conformity in shape with said inner wall of said first through-hole and said second-through-hole is in conformity in shape with said inner wall of said second through-hole, and such that said first and second conductive patterns include respectively first and second overhang structures each extending toward a center of said corresponding through-hole at a level of said top surface of said interlayer insulation film in a direction substantially parallel to a principal surface of said substrate;

depositing a dielectric film over said first and second conductive patterns;

depositing another conductive layer on said dielectric film in each of said first and second through-holes;

patterning said another conductive film and said dielectric film on said top surface of said interlayer insulation film to form a capacitor electrode from said another conductive film and further to form a capacitor dielectric film from said dielectric film, such that said first conductive pattern and said capacitor electrode sandwich said capacitor dielectric film therebetween in said first through-hole;

wherein said step of patterning said another conductive film further includes a step for exposing said second overhang structure in said second through-hole; and wherein said method further includes a step of contacting a bit line pattern to said exposed second overhang structure.

Another object of the present invention is to provide a semiconductor memory device, comprising:

a substrate;

a gate pattern provided on said substrate, said gate pattern forming a word line;

a gate insulation film intervening between said substrate and said gate pattern;

first and second diffusion regions formed in said substrate at both sides of said gate pattern;

a first insulation film provided on said gate pattern in conformity with a cross-sectional shape thereof, such that said first insulation film covers a top surface of said gate pattern and further both side walls of said gate pattern;

a first self-aligned opening defined by said first insulation film, said first self-aligned opening exposing said first diffusion region;

a second self-aligned opening defined by said second insulation film, said second self-aligned opening exposing said second diffusion region;

a second insulation film provided on said substrate so as to cover said gate pattern and said first insulation film;

first and second through-holes formed in said second insulation film so as to expose said first and second self-aligned openings respectively;

a first conductor pattern covering a side wall of said first through-hole, said first conductor pattern further contacting with said first diffusion region at said first self-aligned opening;

a second conductor pattern covering a side wall of said second through-hole, said second conductor pattern further contacting with said second diffusion region at said second self-aligned opening;

a first dielectric film covering said first conductor pattern;

a second dielectric film covering said second conductor pattern;

a first conductor plug covering said first dielectric film and filling said first through-hole;

a second conductor plug covering said second dielectric film and filling said second through-hole; and a bit line pattern provided on said second insulation film in contact with said second conductor pattern, said bit line pattern establishing an electrical contact with said second diffusion region via said second conductor pattern;

said first conductor pattern, said first dielectric film and said first conductor plug forming a memory cell capacitor;

said second conductor pattern having an exposed surface at a level substantially flush with a top surface of said second insulation film, said second conductor pattern including an overhang structure extending toward a center of said second through-hole at said level of said top surface of said second insulation film, said overhang structure thereby providing said exposed surface.

According to the present invention, it is possible to form a desired conductive overhang structure at the top rim of a contact hole in continuation with a conductive film covering a side wall of said contact hole, and a reliable electrical contact characterized by a low resistance is achieved via such a contact hole. The present invention is particularly effective for reducing the contact resistance of a bit line in a DRAM.

Another object of the present invention is to provide a method of fabricating a semiconductor device, comprising the steps of:

forming a contact hole in an insulation film;

depositing a conductive layer on said insulation film such that said conductive layer covers an inner wall of said contact hole and a part of an underlying layer exposed at a bottom of said contact hole;

removing said conductive layer for a part locating above a top surface of said insulation film to form a conductive sleeve in said contact hole;

selectively etching away said insulation film by applying an etching process to said top surface of said insulation film, such that a top part of said conductive sleeve projects in an upward direction from said insulation film; and providing a conductor layer on said insulation film such that said conductor layer establishes an electrical contact at an outer periphery of said conductive sleeve projecting from said insulation film.

Another object of the present invention is to provide a method of fabricating a semiconductor device, comprising the steps of:

forming a second insulation layer on a first insulation layer, said second insulation layer having a larger etching rate than said first insulation layer;

forming a contact hole such that said contact hole penetrates through said second insulation layer and further through said first insulation layer;

applying an etching process to said first and second insulation layers, to form an opening in said second insulation layer with a diameter larger than a diameter of said through-hole;

depositing a conductive layer on said second insulation film such that said conductive layer covers an inner wall of said through-hole and further an exposed part of an underlying layer exposed at a bottom of said through-hole, said conductive layer being deposited further such that said conductive layer covers an exposed top surface of said first insulation film and an inner wall of said opening; and removing said conductive layer for a part located above said second insulation layer.

Another object of the present invention is to provide a method of fabricating a semiconductor device, comprising the steps of:

forming a resist pattern on an insulation film such that said resist pattern has an opening exposing said insulation film;

applying an isotropic etching process to said insulation film through said opening while using said resist pattern as a mask, such that an concaved depression is formed at a top part of said insulation film with a diameter larger than a diameter of said opening;

applying an anisotropic etching process to said insulation film through said opening while using said resist pattern as a mask, to form a through-hole in continuation with said concaved depression with a diameter substantially identical to said diameter of said opening;

depositing, after removing said resist pattern, a conductive layer on said insulation film such that said conductive layer covers an inner wall of said concaved surface and an inner wall of said through-hole;

removing a part of said conductive layer located above said insulation film to form a conductive sleeve, such that said conductive sleeve has a collar extending radially outwardly at a top part thereof in correspondence to said concaved depression.

Another object of the present invention is to provide a semiconductor device, comprising:

a substrate;

an insulation film provided on said substrate;

a through-hole provided on said insulation film so as to extend from a top surface of the said insulation film to a bottom surface of said insulation film;

a conductive sleeve provided in said through-hole such that said conductive sleeve engages with an inner wall of said through-hole and contacts with an underlying layer exposed at a bottom end of said through-hole;

said conductive sleeve including an extension part extending in an upward direction from said top surface of said insulation film; and a conductor pattern contacting said extension part of said conductive sleeve, said conductor pattern contacting a top edge surface of said extension part and an outer peripheral surface of said extension part.

Another object of the present invention is to provide a semiconductor device, comprising:

a substrate;

a first insulation film provided on said substrate;

a second insulation film provided on said first insulation film;

a first through-hole formed in said first insulation film with a first diameter;

a second through-hole formed in said second insulation film with a second, larger diameter in alignment with said first through-hole;

a conductive sleeve covering an inner wall of said first through-hole, said conductive sleeve being in contact with an exposed surface of an underlying layer underlying said first insulation film at a bottom end of said first through-hole, said conductive sleeve including a collar part at a top part thereof such that said collar part extends laterally over a top surface of said first insulation film, said collar part thereby engaging with an inner peripheral wall of said second through-hole.

Another object of the present invention is to provide a semiconductor device, comprising:

a substrate;

an insulation film provided on said substrate;

a through-hole provided on said insulation film such that said through-hole extends from a top surface to a bottom surface of said insulation film;

said through-hole including a top part adjacent to said top surface of said insulation film with an increased diameter; and a conductive sleeve covering an inner wall of said through-hole, said conductive sleeve being in contact with an exposed surface of an underlying layer underlying said insulation film at a bottom end of said through-hole;

said conductive sleeve including a collar part at a top end thereof such that said collar part contacts with said top part of said through-hole.

Other objects and further features of the present invention will become apparent from the following description when read in conjunction with the attached drawings.

DETAILED DESCRIPTION OF THE PREFERRED EMBODIMENTS

Figure 3A:
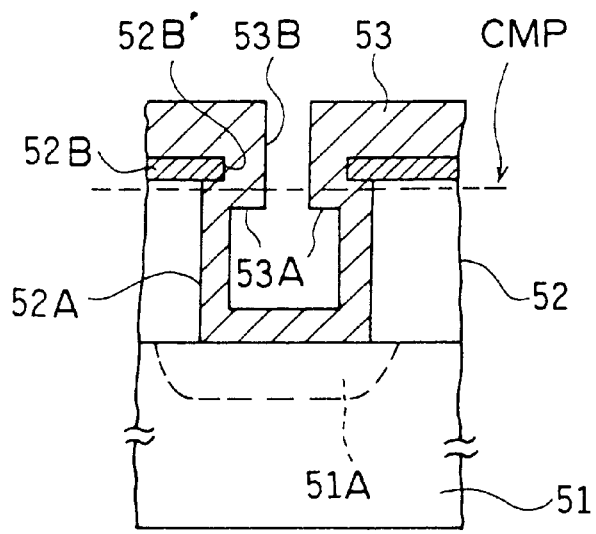
FIGS. 3A–3C are diagrams showing a first embodiment of the present invention.
Figure 3B:
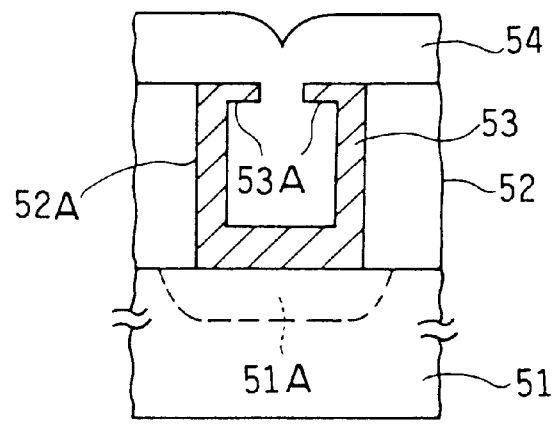
Figure 3C:
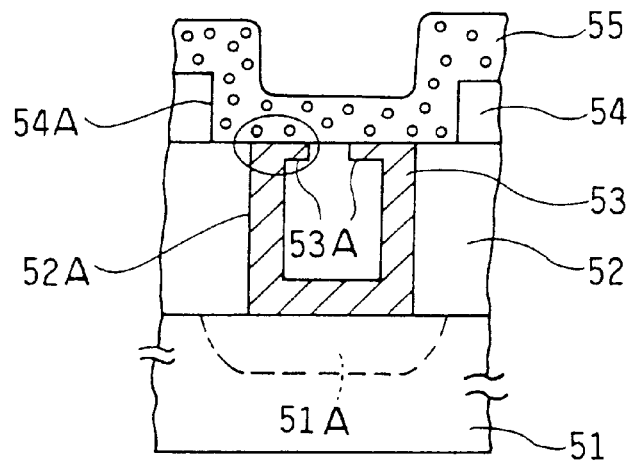

FIGS. 3A–3C show the fabrication process of a contact structure according to a first embodiment of the present invention.

Referring to FIG. 3A, an insulation film 52 of $SiO_2$ or BPSG (borophosphosilicate glass) is provided on a Si substrate 51 in which a diffusion region 51A may be formed. Further, a mask layer 52B, typically formed of amorphous silicon or polysilicon, or alternatively formed of SiN, is provided on the insulation film 52, and an opening 52B' is formed in the mask layer 52B.

Next, an isotropic etching process is applied to the insulation film 52 while using the mask layer 52B as an etching mask. As a result of such an isotropic etching process, which may be a wet etching process, a through-hole 52A is formed in the insulation film 52 with an inner diameter substantially larger than the diameter of the opening 52B', such that the through-hole 52A extends from a top surface to a bottom surface of the insulation film 52. The mask layer 52B thereby forms an overhang structure extending toward a center of the through-hole 52A at the top surface of the insulation film 52.

Next, a conductive film 53 of doped polysilicon or amorphous silicon is deposited on the contact structure preferably by a vapor deposition process such as a CVD process, such that the conductive film 53 covers the exposed diffusion region 51A at the bottom as well as the side wall of the through-hole 52A. Thereby, the conductive film 53 also covers the exposed surface of the overhang structure formed by the mask layer 52B, and as a result, the conductive film 53 forms another overhang structure extending toward the center of the through-hole 52A at the top surface of the insulation film 52.

After the conductive film 53 is thus deposited, the structure of FIG. 3A is subjected to a CMP process until the mask layer 52B is removed. After the mask layer 52B is removed, the CMP process is continued until the mask layer 52B itself is removed. If necessary, the slurry of the CMP process may be changed when polishing the mask layer 52B. The CMP process of the mask layer 52B is continued until the top surface of the insulation film 52 is exposed, and an overhang structure 53A, formed of the conductive film 53, is left at the top surface of the insulation film 52 thus polished.

Next, in the step of FIG. 3B, another insulation film 54 is deposited, after the foregoing CMP process, on the insulation film 52 preferably by a vapor deposition process so as to fill the through-hole 52A covered by the foregoing conductive film 53.

Further, the insulation film 54 thus deposited is patterned in a step of FIG. 3C to form a contact hole 54A such that the contact hole 54A exposes the foregoing through-hole 52A including the overhang structure 53A, and an interconnection layer 55 of polysilicon or Al is deposited on the insulation film 54 including the contact hole 54A. As the contact hole 54A exposes the overhang structure 53A as noted above, the interconnection layer 55 forms an intimate contact with the exposed overhang structure 53A as circled in FIG. 3C. As the foregoing intimate contact occurs two-dimensionally over a substantial area, the problem of increased contact resistance, occurring in conventional contact holes due to the reduced contact area, is successfully eliminated.

Next, a fabrication process of a DRAM 30 according to a second embodiment of the present invention will be described with reference to FIGS. 4A–4D.

Figure 4A:
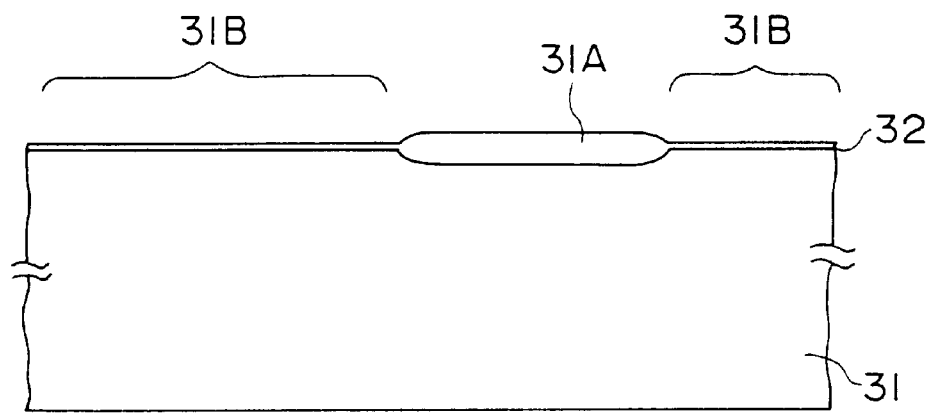
FIGS. 4A–4O are diagrams showing a second embodiment of the present invention.

Referring to FIG. 4A, a field oxide film 31A is formed on a p-type Si substrate 31 so as to define an active region 31B on which a memory cell is to be formed. The field oxide film 31A may be formed with a thickness of 400–500 nm by a wet oxidation process as usual. Further, a gate oxide film 32 is formed on the exposed surface of the Si substrate 31 by a dry oxidation process with a thickness of 20–30 nm.

Figure 4B:
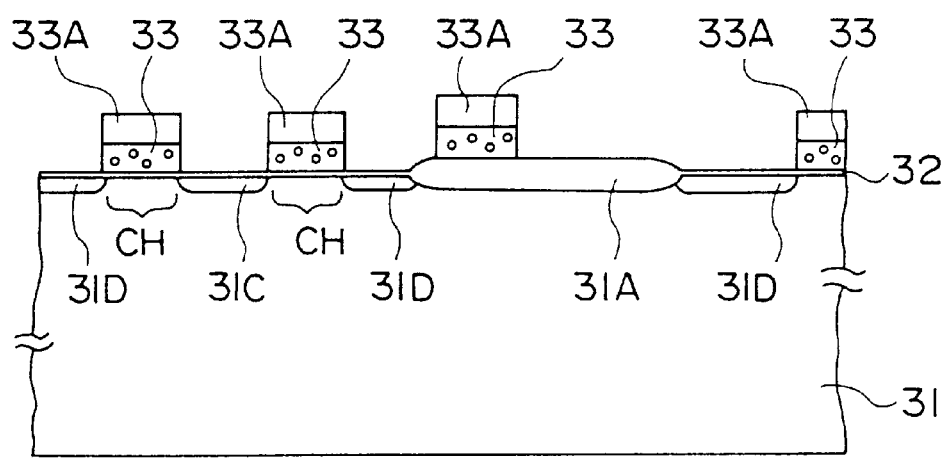

Next, a polysilicon film doped to an $n^+$-type and an $SiO_2$ film are deposited on the structure of FIG. 4A consecutively in a step of FIG. 4B, with respective thicknesses of 200 nm and 30 nm, followed by a photolithographic patterning process conducted by a high-resolution exposure system, to form a polysilicon gate pattern 33 corresponding to the foregoing polysilicon film, wherein the gate pattern 33 carries thereon an oxide pattern 33A corresponding to the foregoing $SiO_2$ film. The polysilicon gate pattern 33 thus formed forms a part of a word line as usual. The illustration of the anti-reflection film, which is used commonly at the time of exposing a gate pattern, is omitted for the sake of simplicity of the drawing.

In correspondence to the polysilicon gate pattern 33, a channel region CH is formed in the Si substrate 31, and diffusion regions 31C and 31D of the $n^+$-type are formed at both lateral sides of the channel region CH by carrying out an ion implantation of $As^+$ of $P^+$ into the Si substrate 31 while using the gate pattern 33 as a self-aligned mask.

Figure 4C:
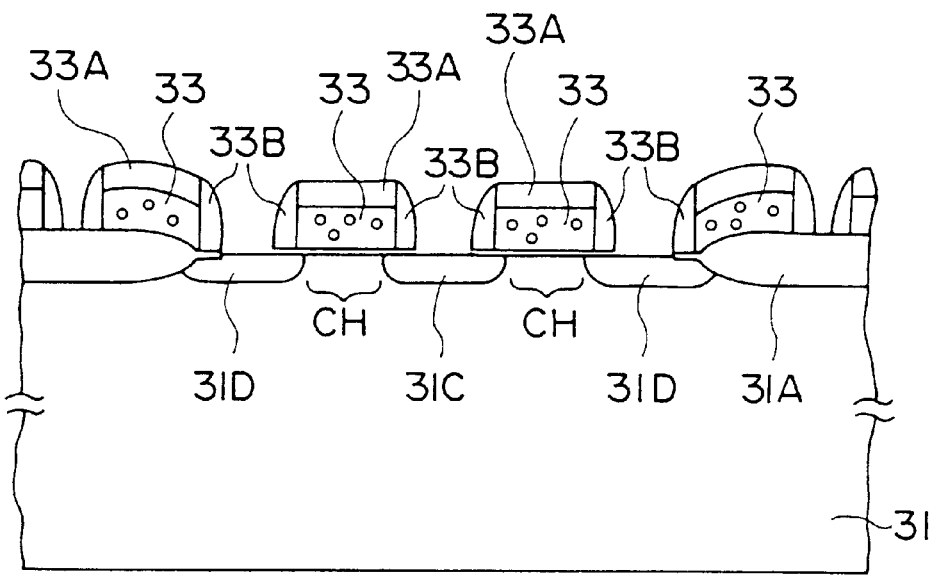

Next, in a step of FIG. 4C, a $SiO_2$ film is deposited on the structure of FIG. 4B with a thickness of typically 90 nm, followed by an anisotropic etching process acting substantially perpendicularly to a substrate principal surface. Typically, the anisotropic etching process is conducted by an RIE process while using $C_2F_6$ as an etching gas, until the substrate surface is exposed at the diffusion regions 31C and 31D.

In the structure of FIG. 4C, it should be noted that the gate pattern 33 is not only covered by the $SiO_2$ film 33A at the top surface but also by $SiO_2$ films 33B at both side walls. Hereinafter, the $SiO_2$ film 33A and the $SiO_2$ films 33B are collectively designated by a numeral 33C.

It should be noted that the foregoing diffusion regions 31C and 31D are exposed in the structure of FIG. 4C at the respective openings that are defined by the foregoing $SiO_2$ film 33C, while the openings thus defined are formed in a self-aligned manner, without using a mask process.

After the structure of FIG. 4C is formed, an ion implantation of $As^+$ or $P^+$ may be conducted into the substrate 31 while using the gate pattern 33 and the oxide film 33C as a mask. As a result of such a second ion implantation process, a LDD (lightly-doped drain) structure is formed for the memory cell transistor.

Figure 4D:
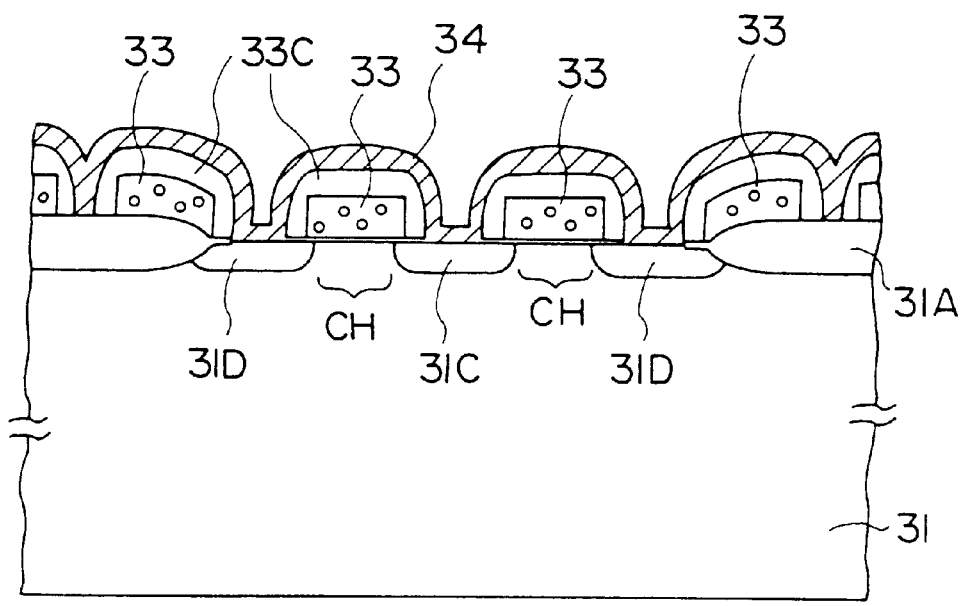
Figure 4E:
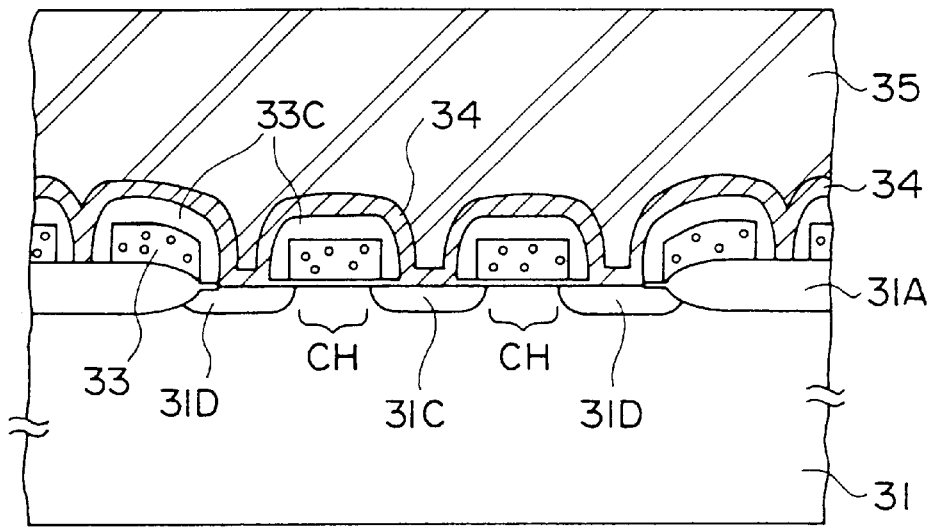
Figure 4F:
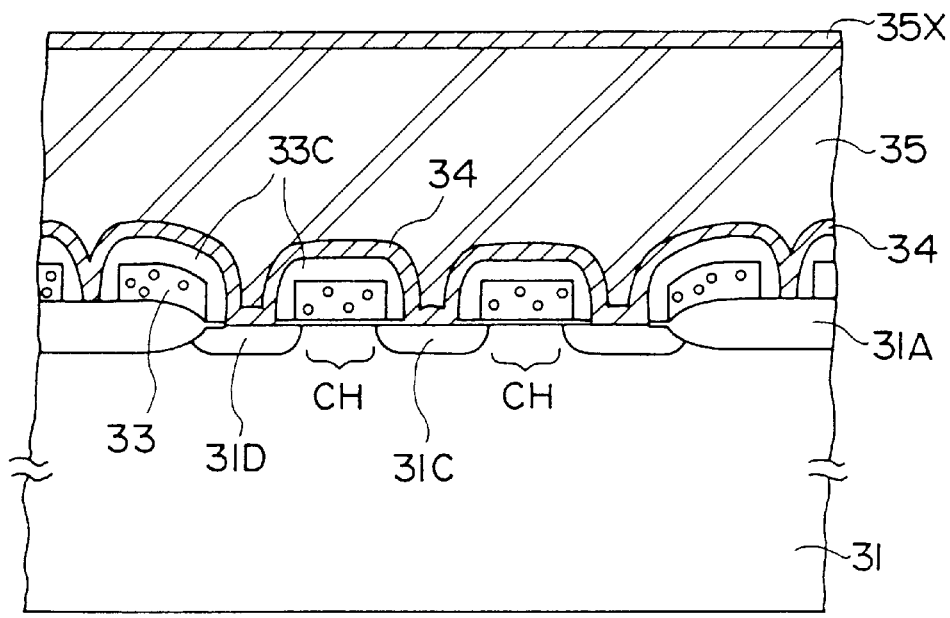

Next, in a step of FIG. 4D, an SiN film 34 is deposited on the structure of FIG. 4C by a CVD process uniformly with a thickness of typically 40 nm, followed by a deposition of an interlayer insulation film 35 of $SiO_2$ or BPSG further on the SiN film 34 in a step of FIG. 4E with a thickness of about 2 μm. The interlayer insulation film 35 thus formed is subsequently subjected to a CMP process for planarization, and a mask layer 35X of amorphous silicon or polysilicon is deposited on the interlayer insulation film 35 thus planarized with a thickness of typically 100 nm as indicated in FIG. 4F.

Figure 4G:
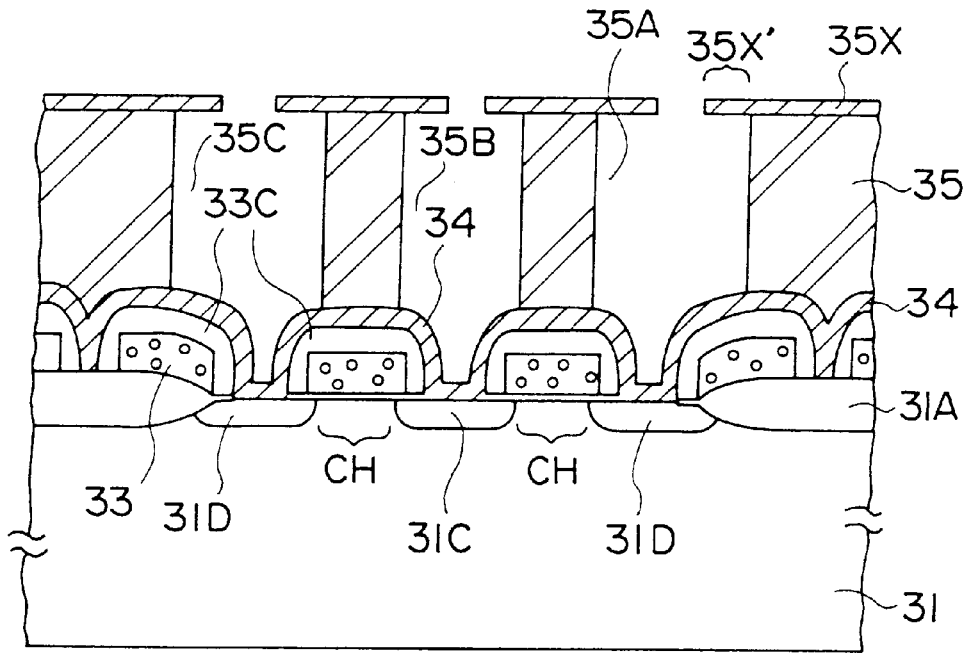

Next, in a step of FIG. 4G, a resist pattern (not shown) is formed on the mask layer 35X in correspondence to the diffusion regions 31C and 31D, and an opening is formed in the mask layer 35X in correspondence to each of the diffusion regions 31C and 31D with an inner diameter of typically 0.3 μm. Further, a wet etching process is applied to the interlayer insulation film 35 through the openings thus formed in the mask 35X isotropically by using HF or a buffered HF solution as an etchant. As a result of the wet etching process, through-holes 35A and 35C are formed in the interlayer insulation film 35 in correspondence to the diffusion regions 31D. Further, a through-hole 35B is formed in the interlayer insulation film 35 in correspondence to the diffusion region 31C.

It should be noted that the wet etching process thus applied acts selectively to $SiO_2$ that forms the interlayer insulation film 35, while the wet etching process stops spontaneously upon an exposure of the SiN film 34. As a result of such a selective isotropic etching, the structure of FIG. 4G is characterized by the through-holes 35A–35C each having an inner diameter larger than the diameter of the opening formed in the mask layer 35X. Thereby, the mask layer 35X forms an overhang 35X' in each of the through-holes 35A–35C.

Figure 4H:
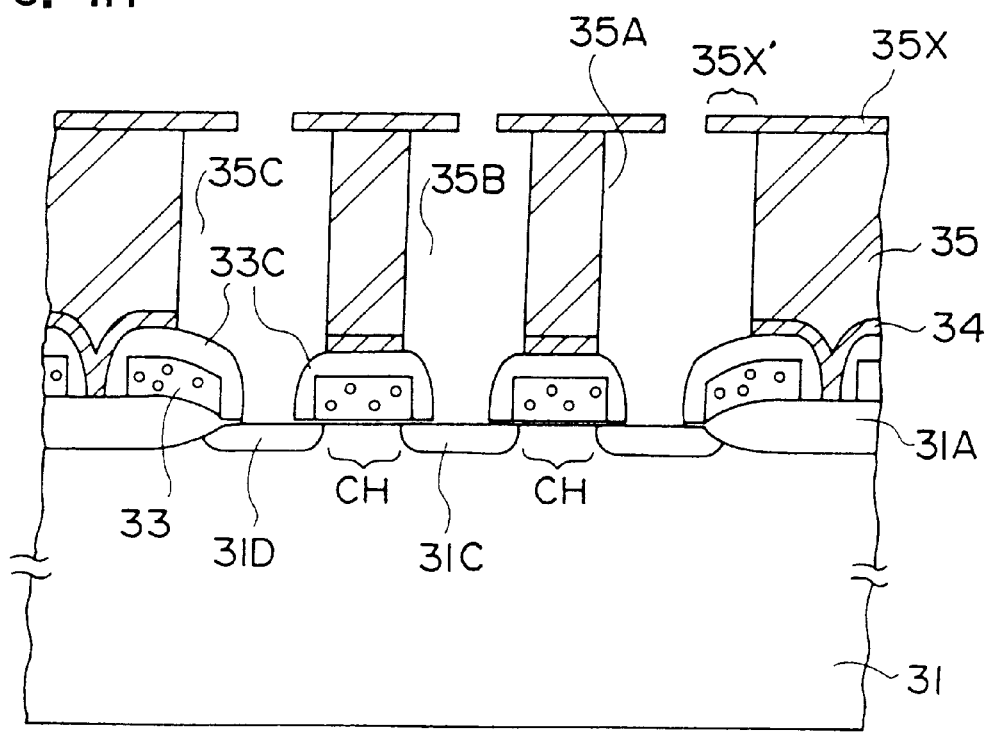

Next, in a step of FIG. 4H, the SiN film 34 exposed at the bottom of the through-holes 35A–35C is removed by an etching process that uses pyrophosphoric acid for the etchant, and the diffusion regions 31C and 31D are exposed as a result.

Figure 4I:
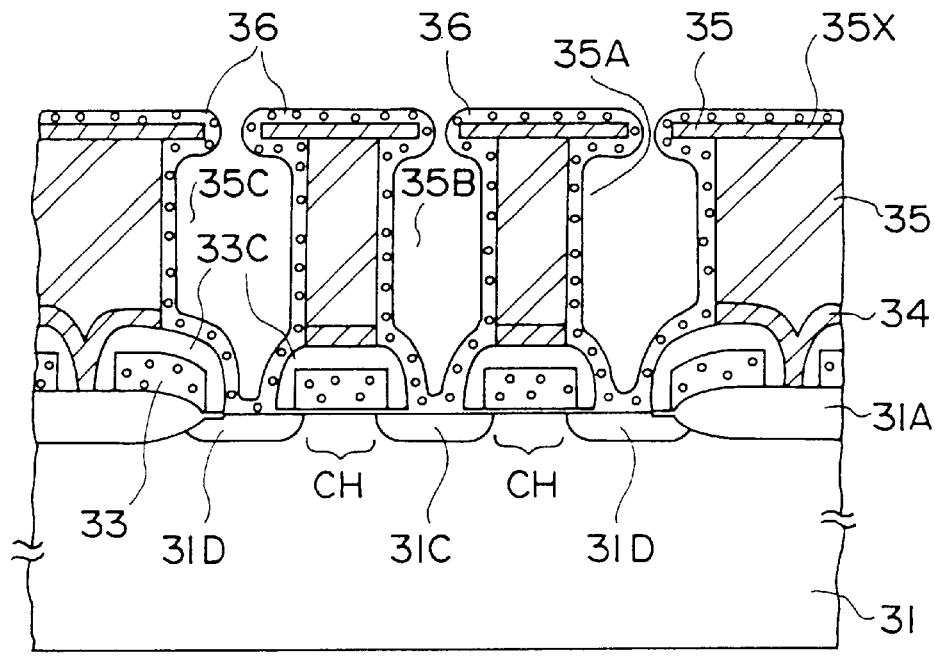

Further, a step of FIG. 4I is conducted in which a doped polysilicon film 36 is deposited on the structure of FIG. 4H by a CVD process with a generally uniform thickness. Thereby, the polysilicon film 36 is deposited not only on the side wall of the through-holes 35A–35C and the exposed diffusion regions 31C and 31D, but also on the exposed top and bottom surfaces of the overhang 35X'.

Figure 4J:
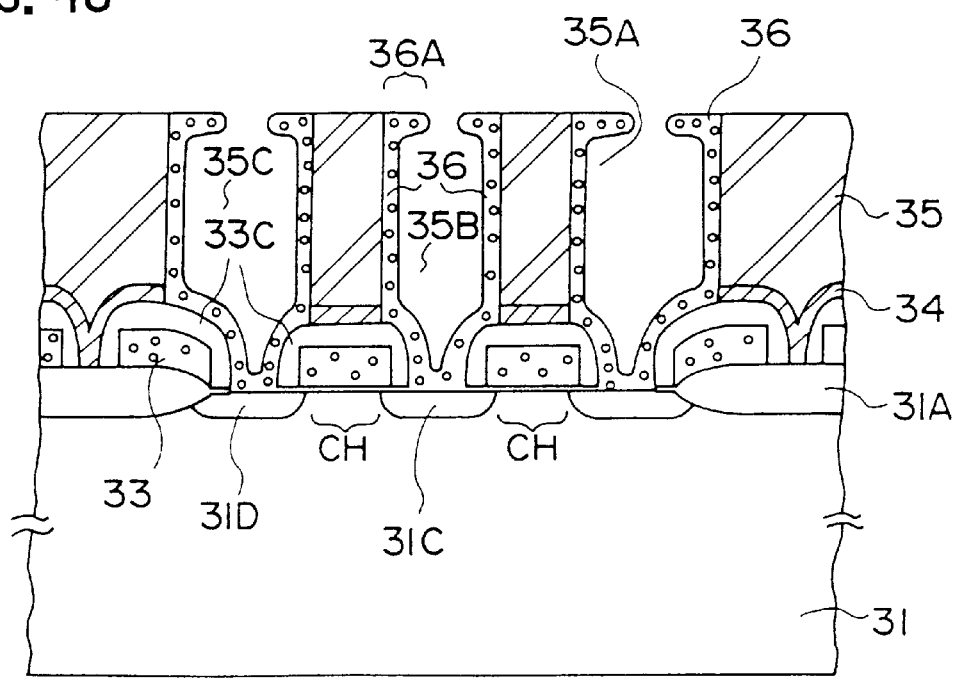

Next, in the step of FIG. 4J, a CMP process is applied to the structure of FIG. 4I while using a silica-base slurry such as a colloidal silica slurry or fumed silica slurry, such that a part of the polysilicon layer 36 locating above the mask layer 35X is removed. The CMP process is continued further, after the foregoing part of the polysilicon layer 36 is removed, until the mask layer 35X itself is removed, wherein the CMP process stops more or less spontaneously when the interlayer insulation film 35 is exposed.

As indicated in FIG. 4J, the structure thus formed includes an overhang part 36A in the polysilicon film 36, wherein the overhang part 36A extends toward the center of the through-hole at the level of the top surface of the interlayer insulation film 35. Typically, the overhang part 36A extends toward the center of the through-hole with a distance of about 20 nm, provided that the through-holes 35A–35C are formed to have an inner diameter of about 0.35 μm. It should be noted that an amorphous silicon film can be used also in place of the polysilicon film 36.

In the process of FIGS. 4I–4J, it is also possible to fill the through-holes 35A–35C by an SOG (spin-on-glass) and remove the SOG covering the structure of FIG. 4I by way of an RIE process. After this, the polysilicon film 36 deposited on the mask 36X and further the mask 36X itself, are etched back consecutively by an RIE process or a wet etching process. Thereafter, the SOG filling the through-holes 35A–35C is removed by a wet etching process. In the foregoing alternative process, it is also possible to use a resist in place of SOG. By protecting the polysilicon film 36 inside the through-holes 35A–35C by SOG or resist, the problem of damaging of the polysilicon film 36 in the through-holes is effectively avoided.

Figure 4K:
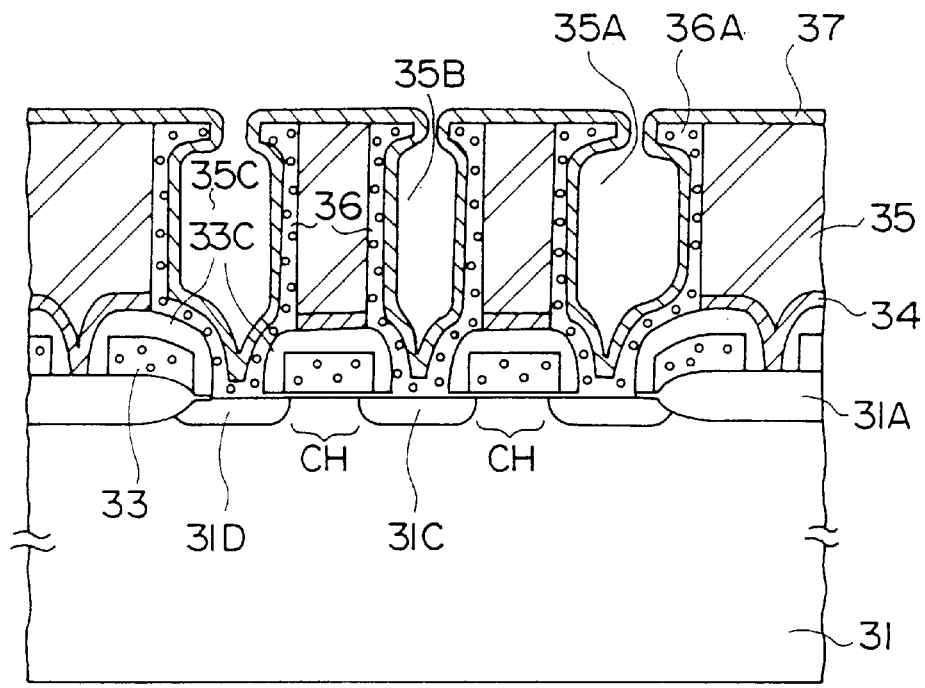
Figure 4L:
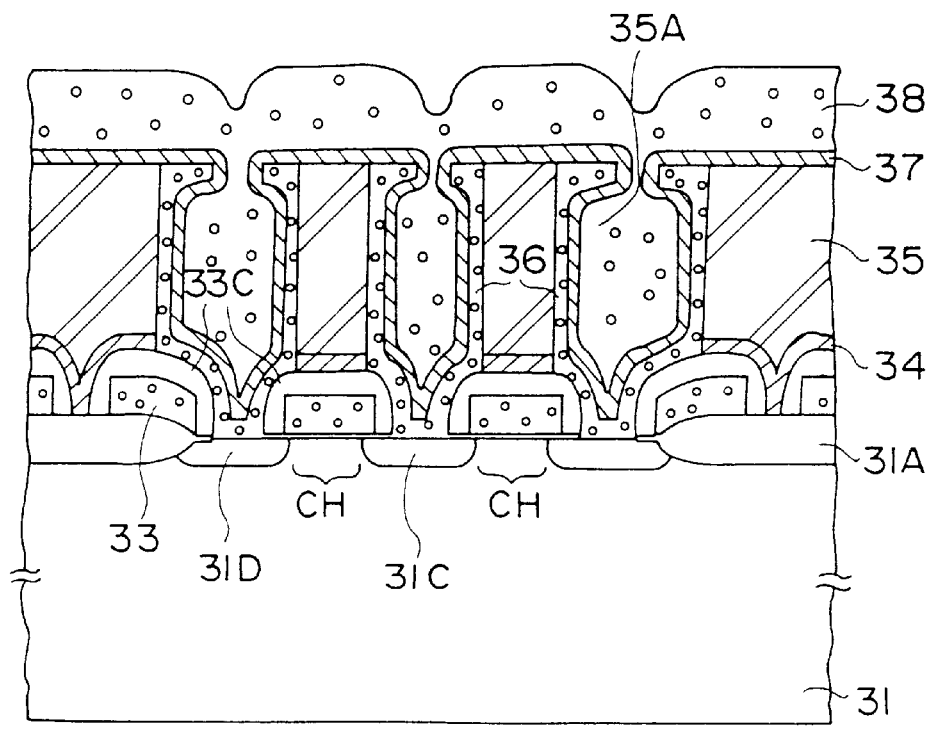

Next, in a step of FIG. 4K, a dielectric film 37 of $Ta_2O_5$ or $(Ba,Sr)TiO_3$ is deposited on the structure of FIG. 4J by a CVD process, such that the dielectric film 37 covers the exposed surface of the interlayer insulation film 35 and further the exposed surface of the polysilicon film 36 including the overhang part 36A, typically with a thickness of 5 nm. Further, a polysilicon film 38 is deposited on the structure of FIG. 4K in a step of FIG. 4L by a CVD process with a thickness of typically 80 nm, such that the polysilicon film 38 forms a polysilicon column filling each of the foregoing through-holes 35A–35C. As noted already, each of the through-holes 35A–35C is covered consecutively by the polysilicon film 36 and the dielectric film 37.

Figure 4M:
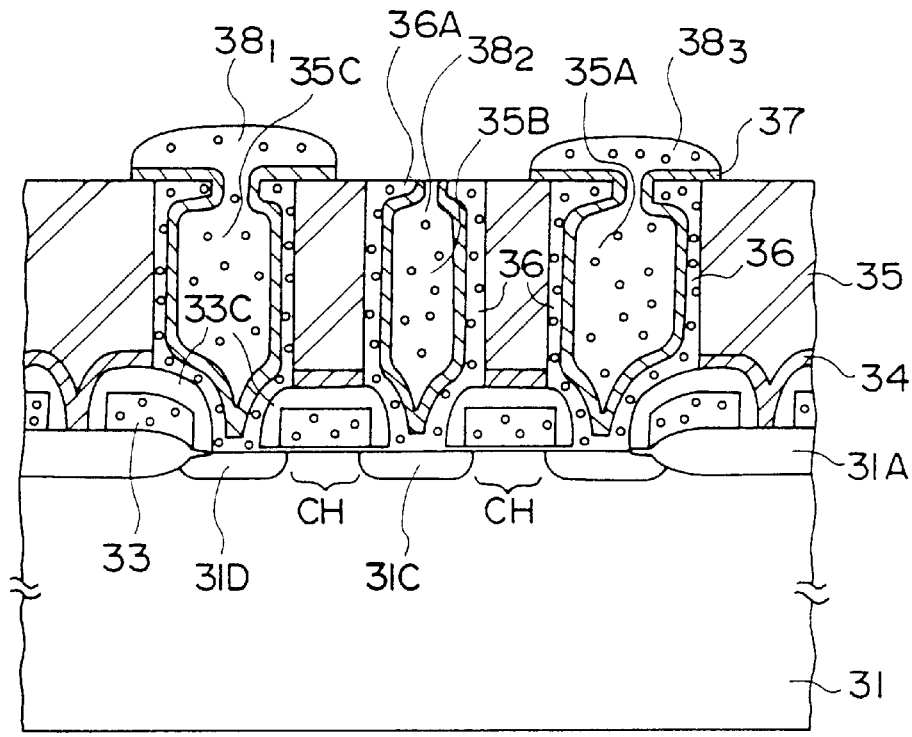

Further, a step of FIG. 4M is conducted in which the dielectric film 37 and the polysilicon film 38 on the interlayer insulation film 35 is patterned, and electrode patterns $38_3$ and $38_1$ are formed respectively in correspondence to the contact holes 35A and 35C. It should be noted that the electrode pattern $38_1$ of $38_3$ is isolated from the polysilicon film 36 by the dielectric film 37. Thus, there is formed a memory cell capacitor in electrical contact with the diffusion region 31D.

In the patterning process of FIG. 4M, it should be noted that the dielectric film 37 and the polysilicon film 36 are removed from the part corresponding to the through-hole 35B. Thereby, the overhang part 36A of the polysilicon film 36 is exposed at the surface of the interlayer insulation film 35.

Figure 4N:
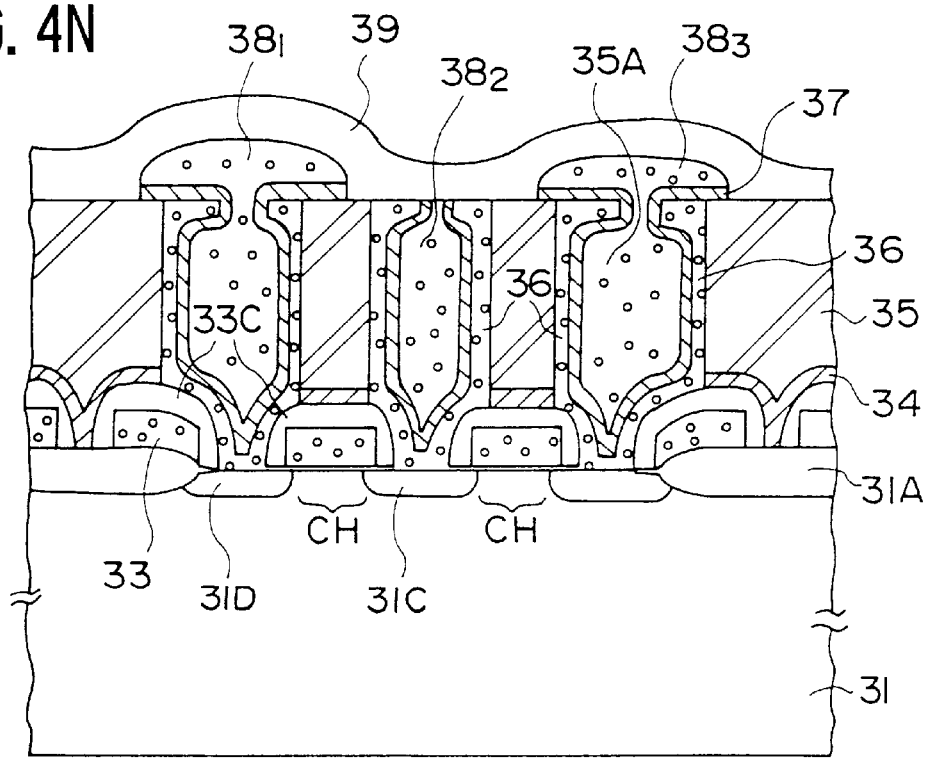
Figure 40:
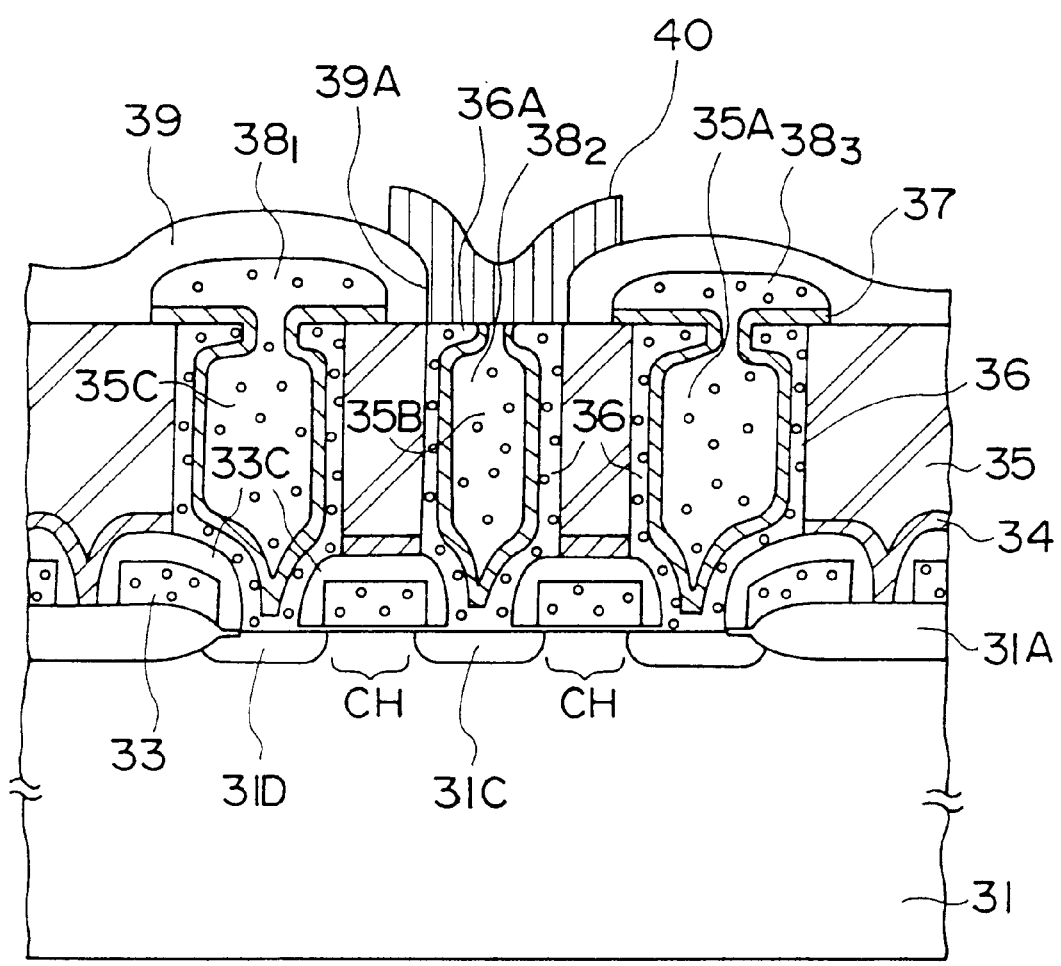

Next, in a step of FIG. 4N, an insulation film 39 is deposited on the structure of FIG. 4M, and an opening 39A is formed in the insulation film 39 in correspondence to the through-hole 35B in a subsequent step of FIG. 4O. As a result, the foregoing overhang part 36A of the polysilicon film 36 in the through-hole 35B is exposed at the opening 39A thus formed. By forming a bit line pattern 40 on the opening 39A, it is possible to achieve an electrical contact between the bit line pattern 40 and the diffusion region 31C via the conductive film 36 in the through-hole 35B.

In the structure of FIG. 4O, it should be noted that the overhang structure 36A of the conductive film 36 provides a sufficient contact area at the level of the top surface of the interlayer insulation film 35. Thus, the contact structure of FIG. 4O is effective for reducing the contact resistance of the bit line pattern 40.

In the embodiments described heretofore, it should be noted that the interlayer insulation film 35 is by no means limited to $SiO_2$ but BPSG or PSG (phosphosilicate glass) may also be used. Further, the bit line pattern 40 may be replaced by an electrode structure that typically includes a Ti/TiN stacking structure.

In the present embodiment, it should be noted that the deposition step for depositing the mask layer 35X of FIG. 4F can be conducted in continuation to the deposition step of the insulation film 35 of FIG. 4E in the same deposition apparatus. Thus, the step of FIG. 4F does not cause any substantial increase of the fabrication steps. Further, it should be noted that the mask pattern 35X formed in the step of FIG. 4G is used also in the step of FIG. 4H as a mask.

Thus, there is no need to carry out a separate mask process in the step of FIG. 4H.

Figure 1:
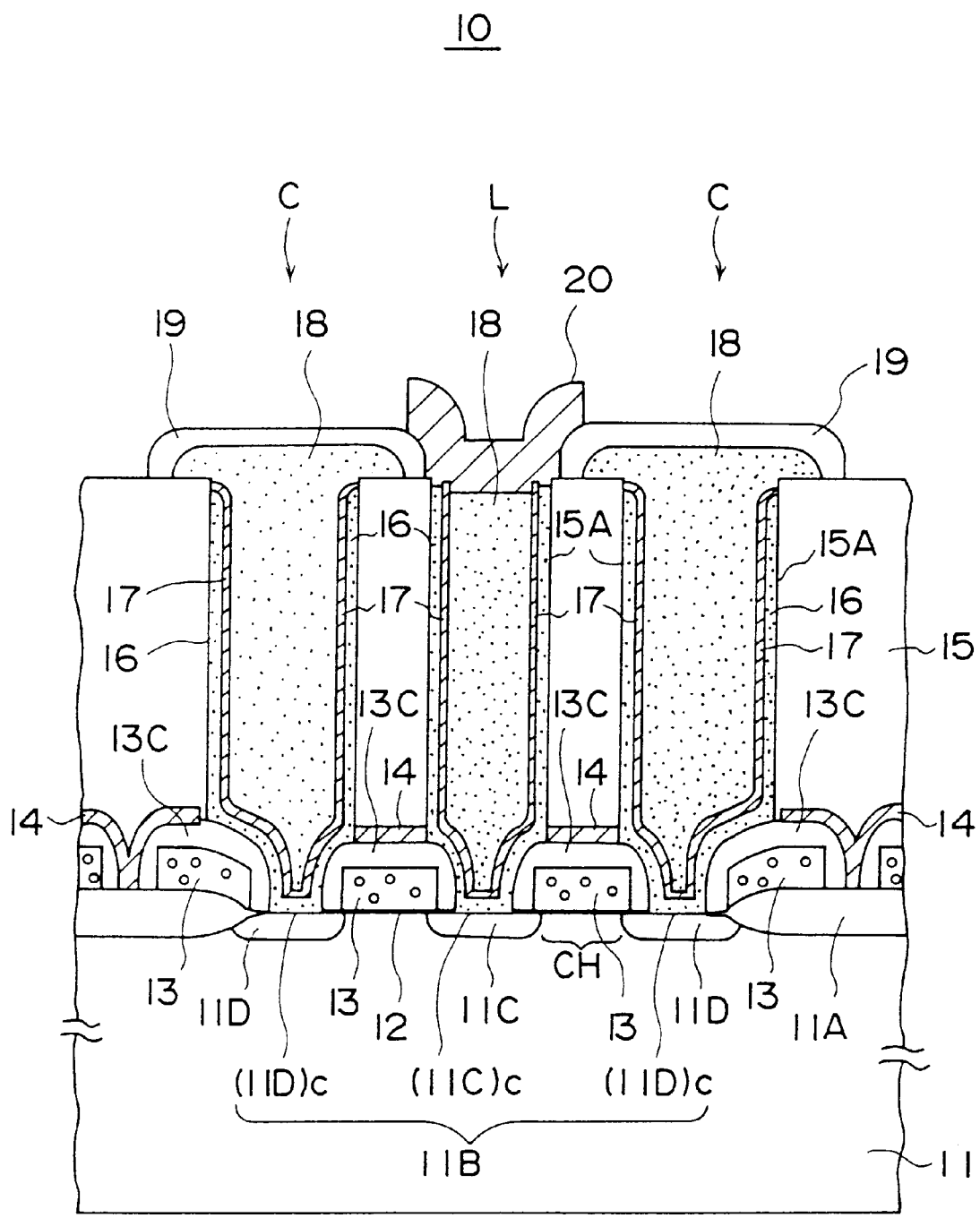
FIG. 1 is a diagram showing the structure of a conventional semiconductor memory device.

Further, the CMP process of FIG. 4J can be conducted in a single step by using a single slurry composition, by forming the mask layer 35X and the conductive film 36 from the same material or materials that show a similar polishing rate with respect to the slurry. Further, there are no added steps in the processes afterwards the step of FIG. 4K as compared with the conventional process for fabricating the DRAM of FIG. 1.

Figure 2A:
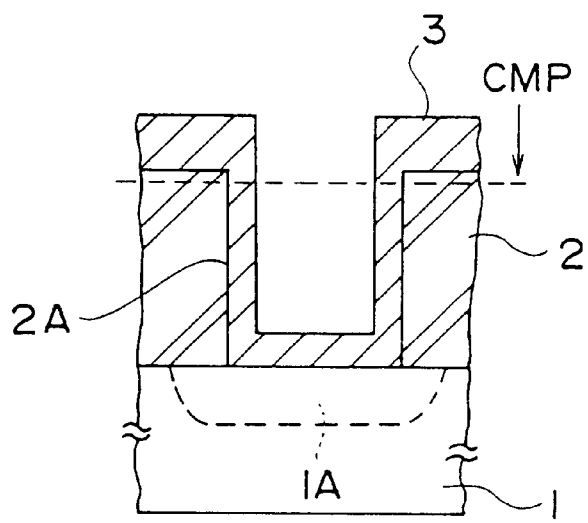
FIGS. 2A–2C are diagrams showing the problem of a conventional contact structure.
Figure 2B:
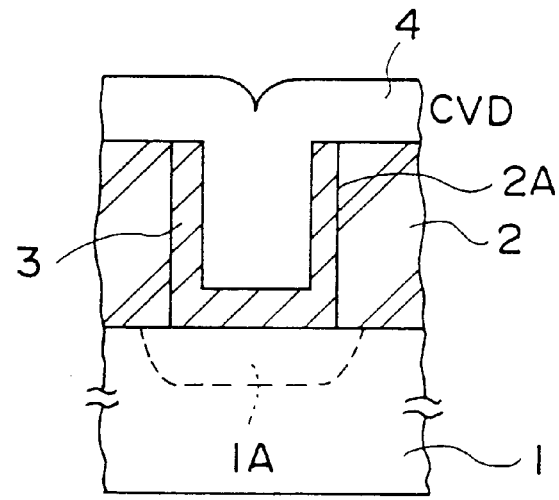
Figure 2C:
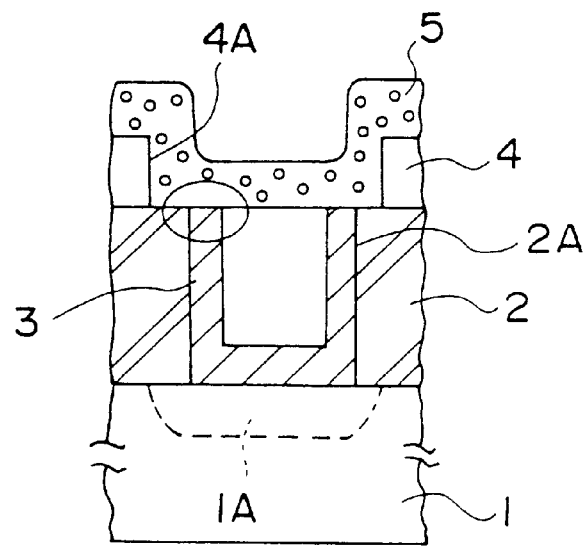

It should be noted that the etching step of FIG. 4H is preferably conducted by a selective etching process that shows a preferential etching for the protective film 34 as compared with the mask layer 35X. Thus, it is preferable to form the mask layer 35X of amorphous silicon or polysilicon in the case the protective film 34 is formed of SiN. In the embodiment of FIGS. 2A–2C, on the other hand, it is possible to use a nitride film such as SiN that shows a selectivity against $SiO_2$, BPSG or PSG, for the mask layer 2B, in addition to amorphous silicon or polysilicon.

Further, the step of FIG. 4I can be conducted by using an amorphous silicon film for the conductive film 36. In this case, the amorphous silicon film 36 may be crystallized later.

FIGS. 5A–5D show a process of forming a contact structure according to a third embodiment of the present invention.

Figure 5A:
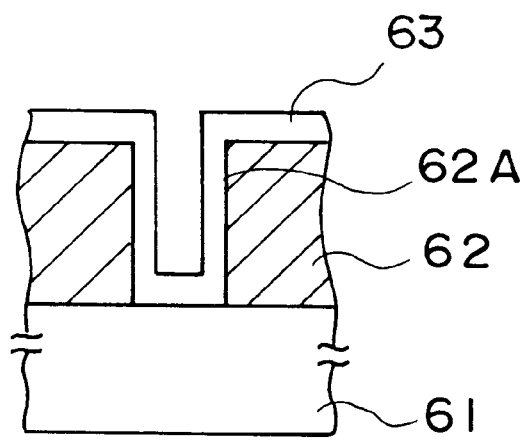
FIGS. 5A–5D are diagrams showing a third embodiment of the present invention.

Referring to FIG. 5A, a substrate 61 corresponding to the substrate 31 is covered by an insulation film 62 of BPSG corresponding to the interlayer insulation film 35, and a contact hole 62A is formed in the insulation film 62 so as to expose a part of the substrate 61. Further, a conductive layer 63 of a doped amorphous silicon is deposited on the structure thus formed so as to cover the side wall of the contact hole 62A and further the exposed bottom surface of the substrate 61.

Figure 5B:
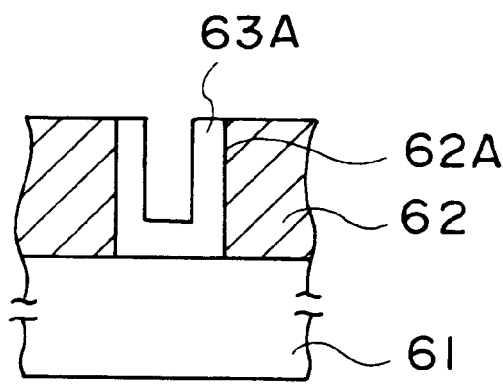

Next, in the step of FIG. 5B, the conductor layer 63 as well as a part of the interlayer insulation film 62 are removed by a CMP process, to form a conductor sleeve 63A such that the conductor sleeve 63A covers the inner wall of the contact hole 62A as well as the exposed bottom surface of the substrate 61. Further, the top surface of the interlayer insulation film 62 is etched in a step of FIG. 5C by a buffered HF etchant to expose a top part 63a of the conductor sleeve 63A formed in the step of FIG. 5B. The etching of the interlayer insulation film 62 may be carried out for about 50 nm.

Figure 5C:
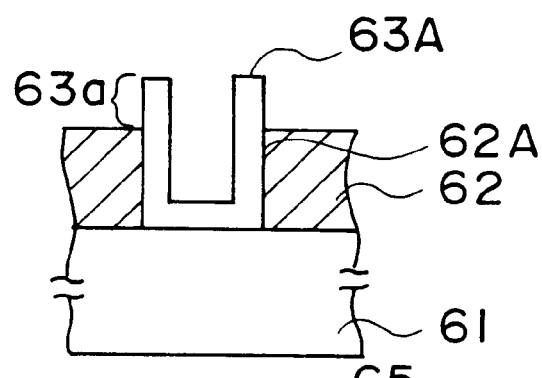
Figure 5D:
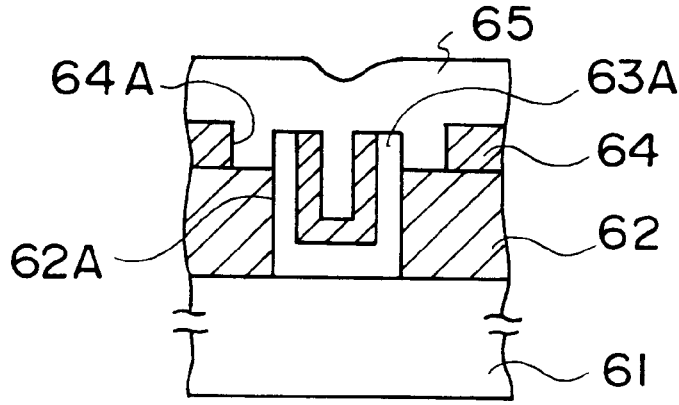

Next, the structure of FIG. 5C is covered by an insulation film 64, and a contact hole 64A is formed in the insulation film 64 so as to expose the foregoing conductor sleeve 63A. It should be noted that the interior of the conductor sleeve 63A may be completely or partially filled with an insulating material forming the insulation film 64. Further, a conductor pattern 65 is deposited on the structure thus formed such that the conductor pattern 65 contacts not only with the top edge of the sleeve 63A but also with the exposed outer surface thereof corresponding to the region 63a. When the thickness of the sleeve 63A is set to about 100 nm, the contact area increases by about 1.5 times by forming the foregoing region 63a, provided that the etching is made in the step of FIG. 5C for about 50 nm.

FIGS. 6A–6D show a process of forming a contact structure according to a fourth embodiment of the present invention.

Figure 6A:
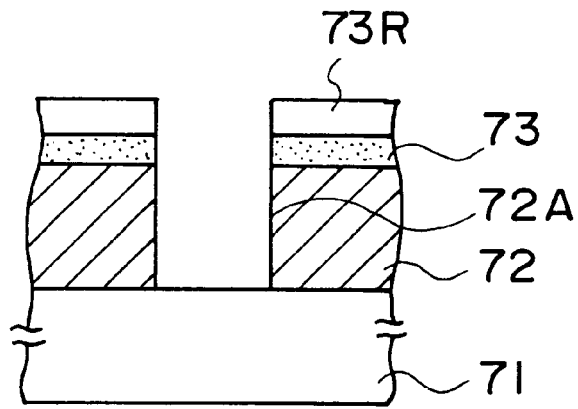
FIGS. 6A–6D are diagrams showing a fourth embodiment of the present invention.

Referring to FIG. 6A, a substrate 71 corresponding to the substrate 31 is covered by an interlayer insulation film 72 of BPSG corresponding to the interlayer insulation film 35, followed by a thermal annealing process conducted in an $N_2$ atmosphere at a temperature of 850° C. for 10 minutes. Further, a deposition of a PSG layer 73 containing P with 10% by weight is made on the interlayer insulation film 72 thus formed with a thickness of about 100 nm. The PSG layer 73 thus formed is further subjected to a thermal annealing process at 700° C. for 20 minutes. After the formation of the PSG layer 73 as such, a resist layer 73R is formed so as to cover the PSG layer 73, and a contact hole 72A is formed by a dry etching process so as to penetrate through the layers 72 and 73 as indicated in FIG. 6A while using the resist layer 73R as a mask.

Figure 6B:
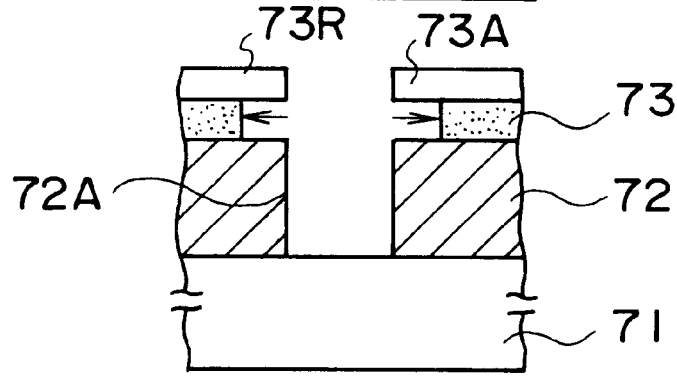

Next, in the step of FIG. 6B, a wet etching process is applied to the PSG layer 72 by immersing the structure of FIG. 6A in a HF solution of 0.5% concentration for 100 seconds, such that the PSG layer 73 is formed with an opening 73A having a larger diameter than the contact hole 72A. In a typical example, the etching process causes an increase of diameter of the contact hole 72 of about 20 nm as a result of the etching of the BPSG layer 72, while the increase of the contact hole diameter is much larger and reaches about 60 nm in the PSG layer 73 due to the increased etching rate of PSG as compared with BPSG. It should be noted that the resist layer 73R is left on the film 73 in the wet etching process of FIG. 6B so as to protect the decrease in the thickness of the PSG layer 73.

Figure 6C:
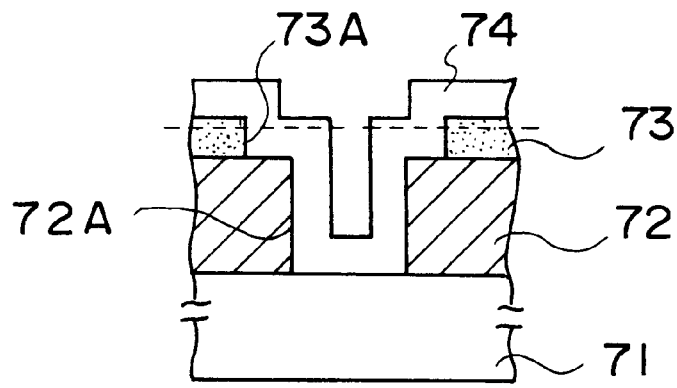
Figure 6D:
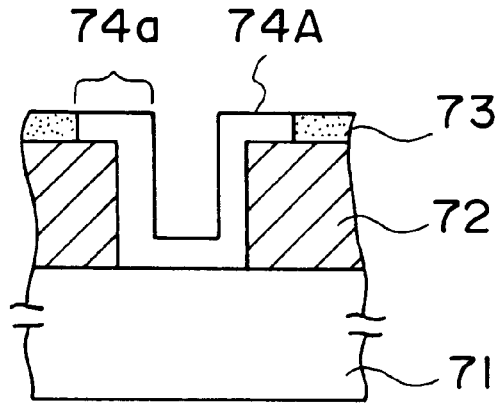

After the structure of FIG. 6B is thus formed, the resist layer 73R is removed, and a conductor layer 74 is deposited thereon in the step of FIG. 6C, and the conductor layer 74 as well as a part of the PSG layer 73 are polished in the step of FIG. 6D by a CMP process.

The contact structure of FIG. 6D thus obtained is characterized a collar part 74a having an increased area at the top part of the conductor sleeve 74A. Thus, the contact structure of FIG. 6D reduces the contact resistance, and the reliability of electrical contact increases substantially.

Figure 7A:
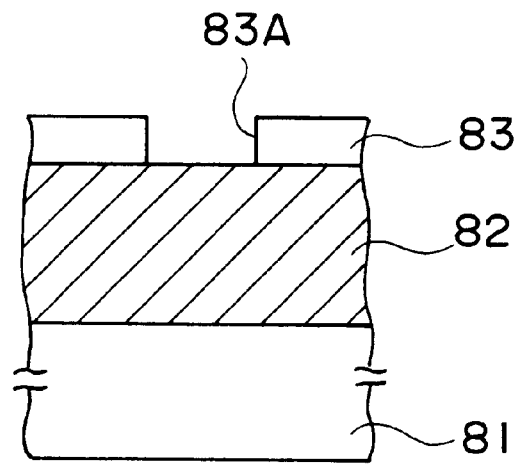
FIGS. 7A–7C are diagrams showing a fifth embodiment of the present invention.
Figure 7B:
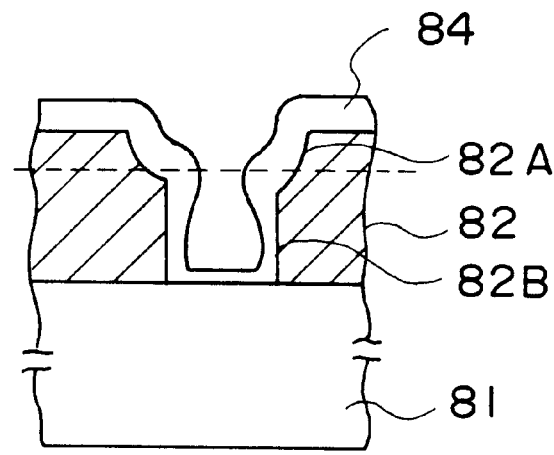
Figure 7C:
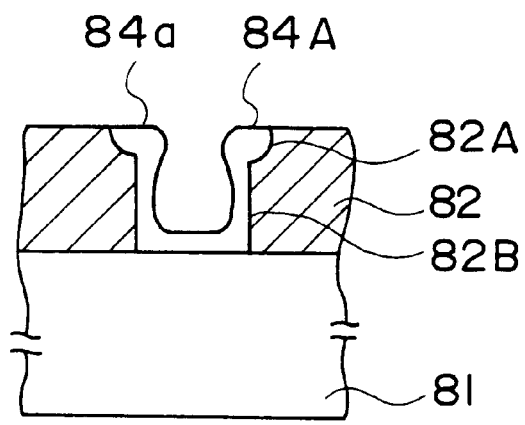

FIGS. 7A–7C show a process of forming a contact structure according to a fifth embodiment of the present invention.

Referring to FIG. 7A, a substrate 81 corresponding to the substrate 31 is covered by an interlayer insulation film 82 of $SiO_2$ corresponding to the interlayer insulation film 35. The interlayer insulation film 35 is then covered by a resist 83 and an opening 83A is formed in the resist 83 in correspondence to the part where the contact structure is to be formed.

Next, in a step of FIG. 7B, a wet etching process is applied to the interlayer insulation film 82 through the opening 83A formed in the resist mask 83, followed by a dry etching process also using the resist 83 as a mask. As a result of the wet etching process, a concaved depression 82A is formed at the top part of the interlayer insulation film 82. On the other hand, the dry etching process forms a vertical throughhole 82B at the bottom of the foregoing concaved depression 82A. Further, a conductor layer 84 is deposited on the structure thus formed after removing the resist mask 83.

Next, the structure of FIG. 7B is subjected to a CMP process in the step of FIG. 7C for removing the conductor layer 84 from the top part of the interlayer insulation film 82 and further for removing the top part of the interlayer insulation film 82 itself. Thereby, a conductive sleeve 84 is formed such that a top rim 84a extends laterally. Thereby, the top rim 84a forms the contact area of the contact structure. As the top rim 84a has an increased area, the contact structure reduces the contact resistance successfully and the reliability of the electrical contact is improved substantially.

It is obvious that the contact structure in any of the foregoing third through fifth embodiment can be applicable to the DRAM of the second embodiment.

Further, the present invention is not limited to the embodiments described heretofore, but various variations and modifications may be made without departing from the scope of the invention.

What is claimed is:

1. A semiconductor device, comprising:

a substrate;

an insulation film provided on said substrate;

a contact hole formed in said insulation film;

a conductive polysilicon film covering an inner surface and a bottom surface of said contact hole, said conductive polysilicon film including an overhang part extending toward an inner side of said contact hole substantially in a plane of a top surface of said insulation film; and a conductive pattern provided on said insulation film in an intimate contact with said overhang of said conductive polysilicon film, said overhang part defining an opening, said opening exposing said conductive polysilicon film covering said bottom surface of said contact hole.

2. The semiconductor device as claimed in claim 1, wherein semiconductor device further includes another insulation film on said insulation film with an opening exposing said overhang of said conductive film.

3. A semiconductor device, comprising:

a substrate;

an insulation film provided on said substrate;

a through-hole provided on said insulation film such that said through-hole extends from a top surface to a bottom surface of said insulation film;

said through-hole including a top part adjacent to said top surface of said insulation film with an increased diameter; and a conductive sleeve covering an inner wall of said through-hole, said conductive sleeve being in contact with an exposed surface of an underlying layer underlying said insulation film at a bottom end of said through-hole;

said conductive sleeve including a collar part at a top end thereof such that said collar part contacts with said top part of said through-hole, said conductive sleeve further including an overhang part extending toward an inner side of said contact hole substantially in a plane of said top surface of said insulation film;

said conductive sleeve defining therein a hollow space, and said collar part having a top surface substantially flush with a top surface of said insulation film, wherein said collar part has a curved side wall in an elevational cross-sectional view.

4. A semiconductor device, comprising:

a substrate;

an insulation film provided on said substrate;

a first through-hole provided in said insulation film such that said first through-hole extends from a top surface to a bottom surface of said insulation film;

a second through-hole provided in said insulation film such that said second through-hole extends from a top surface to a bottom surface of said insulation film;

a first conductor layer covering an inner surface of said first through-hole, said first conductor layer including a first overhang part extending toward an inner side of said first contact hole substantially in a plane of said top surface of said insulation film;

a second conductor layer formed in said first through-hole such that said second conductor layer is electrically isolated from said first conductor layer, said second conductor layer having a lateral extension part extending over said first overhang part laterally in an outward direction of said first through-hole;

a third conductor layer covering an inner surface of said second through-hole, said third conductor layer including a second overhang part extending toward an inner side of said second contact hole substantially in a plane of said top surface of said insulation film;

a fourth conductor layer formed in said second through-hole such that said fourth conductor layer is electrically isolated from said third conductor layer, said fourth conductor layer having a top surface substantially flush with a top surface of said second overhang part.

* * * * *